United States Patent
Liang et al.

(10) Patent No.: US 10,600,616 B2
(45) Date of Patent: Mar. 24, 2020

(54) APPARATUS AND TECHNIQUES TO TREAT SUBSTRATES USING DIRECTIONAL PLASMA AND POINT OF USE CHEMISTRY

(71) Applicant: Varian Semiconductor Equipment Associates, Inc., Gloucester, MA (US)

(72) Inventors: Shurong Liang, Poughkeepsie, NY (US); Costel Biloiu, Rockport, MA (US); Glen Gilchrist, Danvers, MA (US); Vikram Singh, Andover, MA (US); Christopher Campbell, Newburyport, MA (US); Richard John Hertel, Boxford, MA (US); Alex Kontos, Gloucester, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 16/123,621

(22) Filed: Sep. 6, 2018

(65) Prior Publication Data

US 2019/0006149 A1    Jan. 3, 2019

Related U.S. Application Data

(62) Division of application No. 14/808,612, filed on Jul. 24, 2015, now Pat. No. 10,128,082.

(51) Int. Cl.
*H01J 37/00* (2006.01)
*H01J 37/305* (2006.01)
(Continued)

(52) U.S. Cl.
CPC ............ *H01J 37/3053* (2013.01); *C23F 4/00* (2013.01); *H01J 37/08* (2013.01); *H01J 37/1471* (2013.01);
(Continued)

(58) Field of Classification Search
USPC ....................................................... 250/396 R
See application file for complete search history.

(56) References Cited

U.S. PATENT DOCUMENTS 3,930,155 A * 12/1975 Kanomata ............. H01J 37/252
850/9
4,994,164 A * 2/1991 Bernardet ............... H01J 27/08
204/192.38
(Continued)

FOREIGN PATENT DOCUMENTS

| JP | 2014522104 A | 8/2014 |
|---|---|---|
| KR | 1020000044933 A | 7/2000 |
| KR | 1020110098355 A | 9/2011 |

OTHER PUBLICATIONS

Xun Gu, et al., A Novel Metallic Complex Reaction Etching for Transition Metal and Magnetic Material by Low Temperature and Damage-free Neutral Beam Process for Non-volatile MRAM Device Applications, 2014 Symposium on VLSI Technology Digest of Technical Papers, IEEE.

*Primary Examiner* — Phillip A Johnston (57) ABSTRACT

In one embodiment, an apparatus to treat a substrate may include an extraction plate to extract a plasma beam from a plasma chamber and direct the plasma beam to the substrate. The plasma beam may comprise ions forming a non-zero angle of incidence with respect to a perpendicular to a plane of the substrate; and a gas outlet system disposed outside the plasma chamber, the gas outlet system coupled to a gas source and arranged to deliver to the substrate a reactive gas received from the gas source, wherein the reactive gas does not pass through the plasma chamber.

15 Claims, 7 Drawing Sheets

(51) Int. Cl.
  *H01J 37/08* (2006.01)
  *H01J 37/147* (2006.01)
  *C23F 4/00* (2006.01)
  *H01J 37/32* (2006.01)

(52) U.S. Cl.
  CPC .... *H01J 37/3244* (2013.01); *H01J 37/32357* (2013.01)

(56) References Cited

U.S. PATENT DOCUMENTS

| | | |
|---|---|---|
| 7,183,219 B1 | 2/2007 | Hama et al. |
| 8,188,448 B2 * | 5/2012 | Benveniste ............. H01J 37/08 250/492.1 |
| 8,497,486 B1 | 7/2013 | Blahnik et al. |
| 8,546,768 B2 * | 10/2013 | Gierak .................... H01J 37/08 250/296 |
| 8,617,668 B2 * | 12/2013 | Toth .................... C23C 14/0031 427/585 |
| 8,779,400 B2 | 7/2014 | Shichi et al. |
| 9,378,971 B1 * | 6/2016 | Briggs .............. H01L 21/30655 |
| 9,607,720 B2 * | 3/2017 | Stubbers .................. H05H 3/06 |
| 9,706,634 B2 | 7/2017 | Liang et al. |
| 10,128,082 B2 * | 11/2018 | Liang ................... H01J 37/3053 |
| 2001/0055649 A1 | 12/2001 | Ogure et al. |
| 2002/0151182 A1 | 10/2002 | Scott |
| 2006/0060566 A1 | 3/2006 | Puech |
| 2006/0093756 A1 | 5/2006 | Rajagopalan et al. |
| 2008/0223409 A1 | 9/2008 | Horsky et al. |
| 2010/0255665 A1 | 10/2010 | Godet et al. |
| 2010/0330787 A1 | 12/2010 | Sferlazzo |
| 2011/0139748 A1 | 6/2011 | Donnelly et al. |
| 2013/0250293 A1 | 9/2013 | Utlaut et al. |
| 2014/0034611 A1 | 2/2014 | Godet et al. |
| 2014/0272179 A1 | 9/2014 | Radovanov et al. |
| 2015/0044840 A1 | 2/2015 | Kobayashi et al. |
| 2015/0099369 A1 | 4/2015 | Deshmukh et al. |
| 2015/0132961 A1 | 5/2015 | Chang et al. |
| 2015/0179409 A1 | 6/2015 | Biloiu et al. |

\* cited by examiner

APPARATUS AND TECHNIQUES TO TREAT SUBSTRATES USING DIRECTIONAL PLASMA AND POINT OF USE CHEMISTRY

This application is a divisional of, and claims the benefit of priority to, U.S. patent application Ser. No. 14/808,612, filed Jul. 24, 2015, entitled "Apparatus And Techniques To Treat Substrates Using Directional Plasma And Point Of Use Chemistry," which application is incorporated herein by reference in its entirety.

FIELD

The present embodiments relate to electronic device processing techniques, and more particularly, to processing for treating the surface of a substrate.

BACKGROUND

As integrated devices continue to scale to smaller dimensions, the ability to pattern features becomes increasingly difficult. These difficulties include in one aspect the ability to etch features to preserve or transfer a pattern into a substrate. In many device applications a patterned feature may include a metal layer that is difficult to etch because the metal does not readily form volatile etch products using known reactive ion etching or similar processes. Etching of metal layers via physical sputtering may be problematic because of the tendency for sputtered species of a given metal layer to redeposit on unwanted surfaces of the substrate including on surfaces of device features being formed. This may lead to patterned structures such as pillars or lines having non-vertical sidewalls, as well as having excessive material redeposited from etching of a non-volatile metal underlayer.

With respect to these and other considerations the present improvements may be useful.

SUMMARY

This Summary is provided to introduce a selection of concepts in a simplified form further described below in the Detailed Description. This Summary is not intended to identify key features or essential features of the claimed subject matter, nor is the summary intended as an aid in determining the scope of the claimed subject matter.

In one embodiment, an apparatus to treat a substrate may include an extraction plate to extract a plasma beam from a plasma chamber and direct the plasma beam to the substrate, the plasma beam comprising ions forming a non-zero angle of incidence with respect to a perpendicular to a plane of the substrate; and a gas outlet system disposed outside the plasma chamber, the gas outlet system coupled to a gas source and arranged to deliver to the substrate a reactive gas received from the gas source, wherein the reactive gas does not pass through the plasma chamber.

In another embodiment, a system to treat a substrate may include a plasma chamber to house a plasma; an extraction plate to extract a plasma beam from the plasma chamber and direct the plasma beam to the substrate, the plasma beam comprising ions forming a non-zero angle of incidence with respect to a perpendicular to a plane of the substrate; and a gas outlet system disposed outside the plasma chamber, the gas outlet system coupled to a gas source and arranged to deliver to the substrate a reactive gas received from the gas source, wherein the reactive gas does not pass through the plasma chamber.

In another embodiment, a method of treating a substrate may include extracting a plasma beam from a plasma, wherein the plasma beam comprises ions forming a non-zero angle of incidence with respect to a perpendicular to a plane of the substrate; and directing a reactive gas from a gas source to the substrate, wherein the reactive gas does not pass through the plasma.

DETAILED DESCRIPTION

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

This present embodiments provide novel apparatus and novel techniques to treat substrates and in particular novel apparatus and techniques to treat a substrate surface, such as to etch a surface feature. As used herein the term "substrate" may refer to an entity such as a semiconductor wafer, insulating wafer, ceramic, as well as any layers or structures disposed thereon. As such, a surface feature, layer, series of layers, or other entity may be deemed to be disposed on a substrate, where the substrate may represent a combination of structures, such as a silicon wafer, oxide layer, metal layer, and so forth.

In various embodiments, apparatus are disclosed that provide ion beam (or "plasma beam") treatment of a substrate as well as reactive gas treatment of the substrate. The ion beam and reactive gas may be provided in a configuration and manner that delivers point-of-use reactive chemistry to a surface of a substrate being treated, such as a substrate being etched.

Figure 1A:
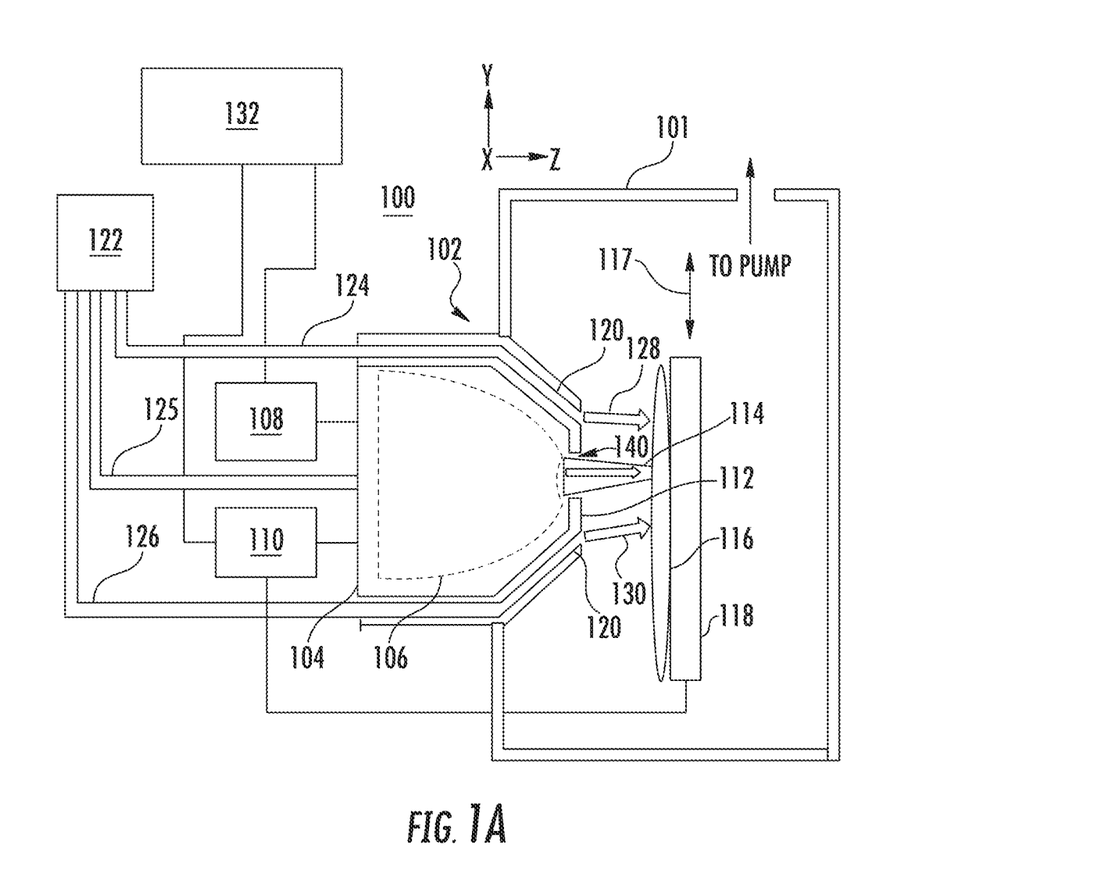
FIG. 1A depicts a system according to embodiments of the disclosure.
Figure 1B:
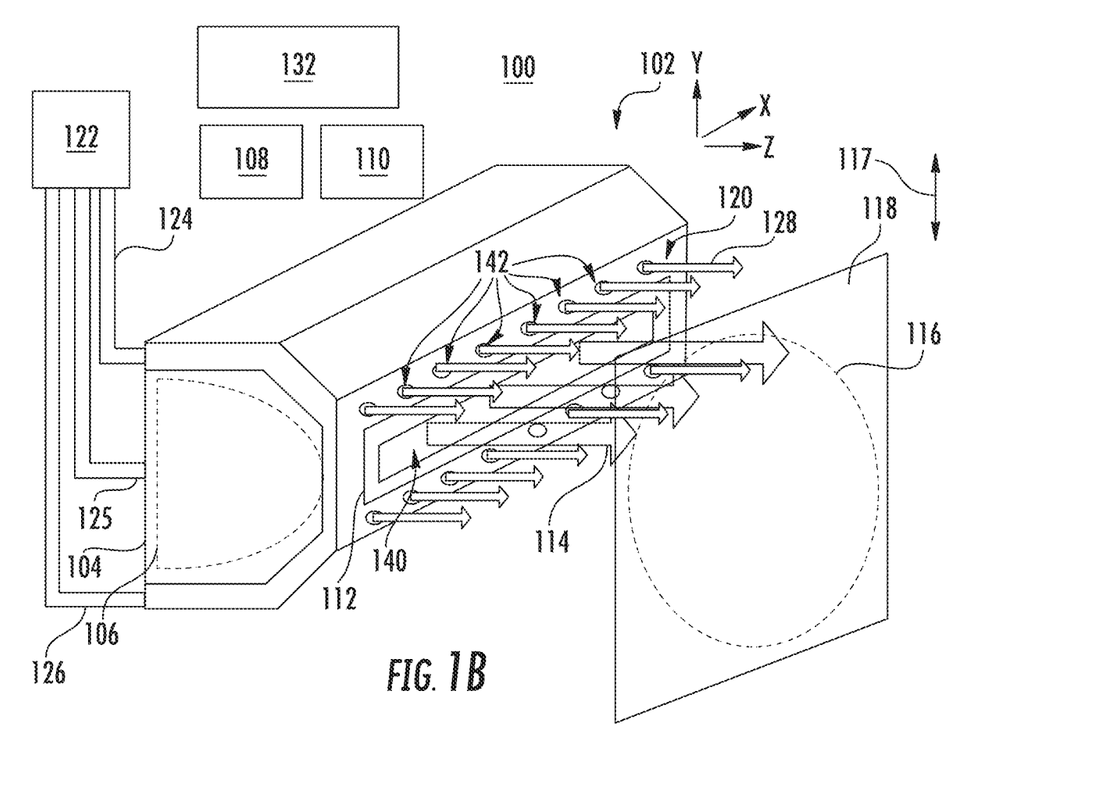
FIG. 1B depicts one embodiment of the system of FIG. 1A.
Figure 1C:
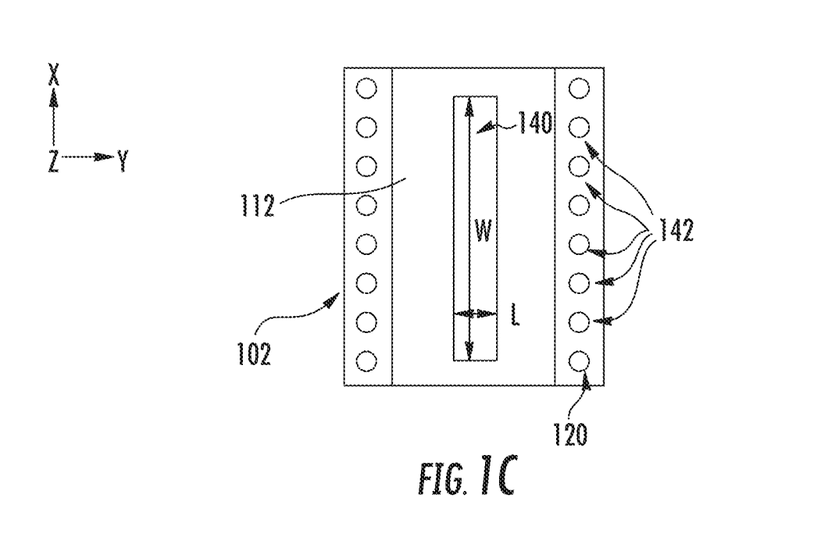
FIG. 1C depicts a plan-view of the embodiment of an apparatus of FIG. 1B.
Figure 1D:
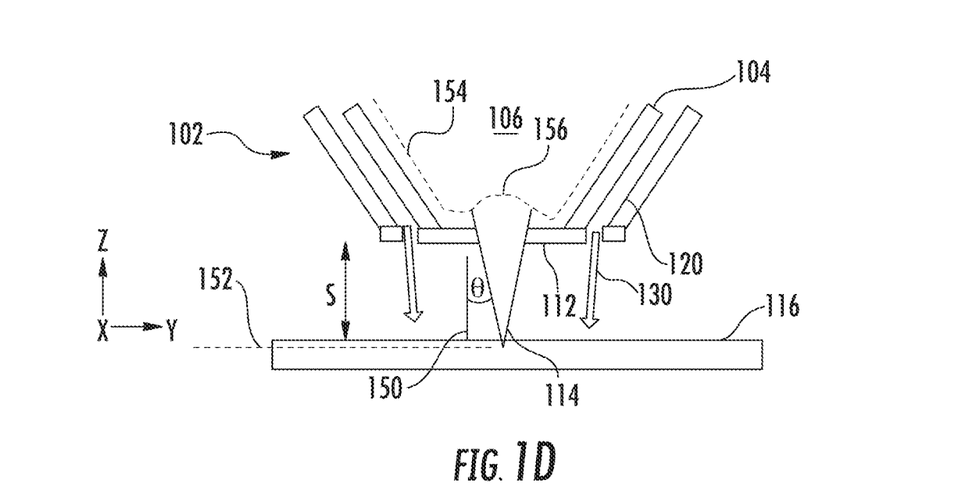
FIG. 1D depicts details of geometry of a processing apparatus and substrate according to various embodiments.

FIG. 1A depicts a system 100 according to embodiments of the disclosure. The system 100 includes a hybrid processing apparatus, shown in cross-section as the apparatus 102. FIG. 1B depicts one embodiment of the system 100 including a perspective view of an embodiment of the apparatus 102. FIG. 1C depicts a plan-view of the embodiment of apparatus 102 of FIG. 1B, while FIG. 1D depicts details of geometry of an apparatus 102 and substrate according to various embodiments. As detailed in FIG. 1A, the system 100 may include a plasma chamber 104 to house a plasma 106. In some embodiment, the plasma chamber 104 may be operated at pressures between 1 mTorr and 300 mTorr. The embodiments are not limited in this context. As shown in FIG. 1A, the plasma chamber 104 is disposed adjacent a processing chamber 101, where a lower pressure below 10-5 Torr may be maintained by a vacuum pumping system comprised of known pumping apparatus, such as a turbomolecular drag pumps backed by rotary pumps. Gaseous plasma precursor may be fed into the plasma chamber 104 from a gas manifold 122 through a plasma gas line 125. In various embodiments, inert gases (He, Ne Ar, Kr, Xe) or mixtures of inert gases with reactive gases such as H2, NF3, Cl2, Br2 CxFy etc.) may be used as plasma precursors, where inert gas ions may form in addition to reactive gas ions in the plasma chamber 104. The plasma 106 may be generated by coupling electric power from a power generator 108 to the rarefied gas in the plasma chamber 104 through an adequate plasma exciter. In the followings the generic term "plasma source" includes the power generator, the plasma exciter, the plasma chamber, and the plasma itself. The plasma source may be an, inductively-coupled plasma (ICP) source, toroidal coupled plasma source (TCP), capacitively coupled plasma (CCP) source, helicon source, electron cyclotron resonance (ECR) source, indirectly heated cathode (IHC) source, glow discharge source, or other plasma sources known to those skilled in the art. Therefore, depending on the nature of the plasma source the power generator 108 may be an rf generator, a dc power supply, or a microwave generator, while plasma exciter may include rf antenna, ferrite coupler, plates, heated/cold cathodes, helicon antenna, or microwave launchers. The system 100 further includes a bias power supply 110 connected to the plasma chamber 104 or to a substrate holder 118. Extraction of an plasma beam 114 comprising positive ions through the extraction plate 112 may accomplished by either elevating the plasma chamber 104 at positive potential and grounding the substrate holder 118 or by grounding the plasma chamber 104 and applying negative potential on the substrate holder 118. The bias power supply 110 may operate in either a dc mode or pulsed mode having a variable duty cycle, or an AC mode. The extraction plate 112 may be arranged generally according to known design to extract ions in the plasma beam 114 in a manner that allows control of the ion angular distribution, i.e., the angle of incidence of the plasma beam 114 with respect to a substrate 116 and the angular spread as detailed below.

The apparatus 102 also includes a reactive gas outlet assembly, shown as gas outlet assembly 120, where the gas outlet assembly 120 is capable of delivering a reactive gas 128 to the substrate 116. The gas outlet assembly 120 is coupled to the gas manifold 122 an may include a plurality of gas outlets. The gas manifold 122 may include a source of the reactive gas 128 in liquid or gaseous form in addition to the gas precursor for the plasma 106, as discussed above. The gas manifold 122 in some embodiments may include more than one source of reactive gas, and more than one source of plasma gaseous precursor where the different sources contain different gases. The gas manifold 122 may be coupled to the gas outlet assembly 120 via one gas line or over a plurality of gas lines. In the example of FIGS. 1A and 1B, the reactive gas source 122 is coupled to a gas line 124 and a gas line 126, where the different gas lines enter the gas outlet assembly 120 at different portions of the apparatus 102.

The system 100 further includes a control system 132. The control system 132 may be coupled to various components of system 100 including bias power supply 110, plasma power supply 108, and gas manifold 122. The control system 132 may be arranged to vary at least one system parameter of system 100. Examples of a system parameter include level of RF power applied to the plasma chamber 104, RF waveform, extraction voltage of the ion beam applied by the bias power supply 110, the duty cycle and frequency of the pulsed bias voltage, or z spacing between substrate 116 and extraction plate 112, meaning the spacing along the Z-axis between substrate 116 and extraction plate 112. The configuration of the extraction plate 112 is another example of a system parameter and may include the shape or size of apertures in the extraction plate, and so forth. At least one of these system parameters may be varied from a first value to a second value, wherein the plasma beam 114 has a first shape at the first value and a second shape at the second value. In this manner parameters of the plasma beam 114 such as angle of incidence on the substrate, angular spread (ranges of angles of incidence), and so forth, may be controlled. This allows the plasma beam 114 to be directed to a substrate according to an application. For example, when the substrate 116 includes patterned features (not shown in FIG. 1A), vertical surfaces of a patterned feature may be better treated by directing the plasma beam 114 at a first angle of incidence, while horizontal surfaces may be better treated by directing the plasma beam 114 at a second angle of incidence.

Turning now to FIG. 1B in particular there is shown one embodiment of the gas outlet assembly 120 where a plurality of gas orifices 142 are provided, extending along top and bottom sides of the extraction aperture 140 of extraction plate 112. Because the reactive gas 128 is channeled from the gas manifold 122 to gas outlet assembly 120 while not passing through the plasma chamber 104, in various embodiments the reactive gas 128 may be directed to impinge on the substrate 116 while not being ionized, or otherwise excited. In this manner a neutral reactive gas may be provided to the substrate. In addition, the reactive gas may remain in a non-dissociated state (or intact state) when impinging on the substrate. The ability to provide such "point of use chemistry" where reactive gas may be provided directly to a substrate allows in some instances an unionized, non-dissociated, and unexcited gas species to contact the substrate. In other instances dissociation, radical generation, excitation, or ionization may take place when conditions such as gas flow rate, gas pressure proximate the substrate 116, or other factors are adjusted to increase interaction with plasma beam 114.

While the plasma beam 114 may be spatially confined according to the size of the extraction aperture 140 and the voltage difference established between the substrate 116 and plasma 106, the reactive gas 128 may spread out after exiting the gas outlet assembly 120. As detailed below, in regions where the ions of plasma beam 114 and reactive gas 128 overlap on the substrate 116, etching of the substrate 116 may take place.

In various embodiments as illustrated in FIG. 1B and FIG. 1C, the extraction aperture 140 may have an elongated shape. For example, as shown in FIG. 1C, the extraction aperture 140 may have an aperture width W along a first direction parallel to the X-axis in the Cartesian coordinate system shown. The extraction aperture 140 may have an aperture length along a second direction perpendicular to the first direction, in other words, along the Y-axis, wherein the aperture width W is greater than the aperture length L. This may generate the plasma beam 114 as a ribbon beam. In some examples W may have a value in the range of 150 mm to 300 mm or greater, while L has a value of 3 mm to 30 mm In order to treat a substrate 116 in its entirety, the substrate holder 118 may scan the substrate along the direction 117 parallel to the Y-axis, for example. Turning also to FIG. 1D, in various embodiments, the plasma beam 114 may be parallel, convergent, or divergent, and may provide ions having broad angular distributions (trajectories distributed over a wide range of angles of incidence around mean angle of incidence), such as 30 degrees or greater, or ions may have a narrow angular distribution (trajectories distributed over a narrow range of angles of incidence), such as less than 5 degrees. The ions may form a non-zero angle of incidence, shown as □, with respect to a perpendicular 150 to a plane 152 of the substrate 116, where the plane 152 may lie parallel to the X-Y plane. The distribution of angles of incidence may be characterized by a monomodal distribution or a bimodal distribution in different embodiments. As shown in FIG. 1D a given distribution of angles of incidence for plasma beam 114 may be determined by the shape of a plasma sheath boundary 154 of the plasma 106. In particular, a meniscus 156 may form in the extraction aperture 140 from which ions of the plasma beam 114 are extracted. The shape of the meniscus 156 may be adjusted by varying parameters such as plasma density (for example, RF power and/or gas pressure in the plasma chamber) extraction voltage applied between plasma chamber 104 and substrate 116, or the extraction plate-substrate holder gap length. In some embodiments, a beam blocker (not shown) may be provided within plasma chamber 104 adjacent the extraction aperture 140 to define two separate plasma beams that are extracted through the extraction aperture 140. In the above manner the angle(s) of incidence of ions of the plasma beam 114 may be controlled.

Figure 2A:
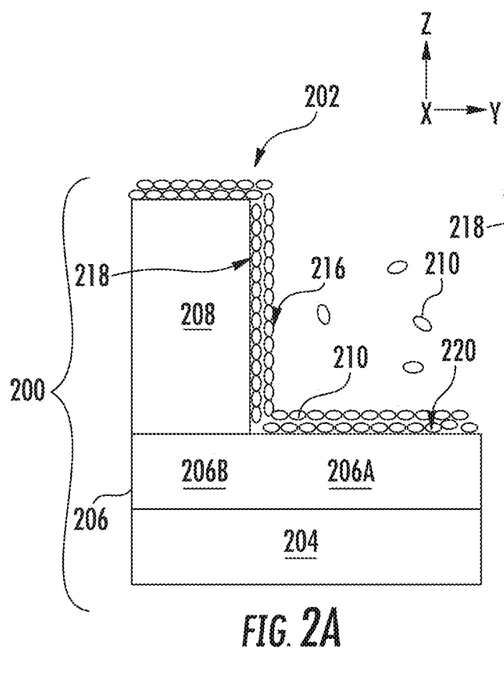
FIG. 2A through FIG. 2D depict an example of substrate etching according to embodiments of the disclosure.
Figure 2B:
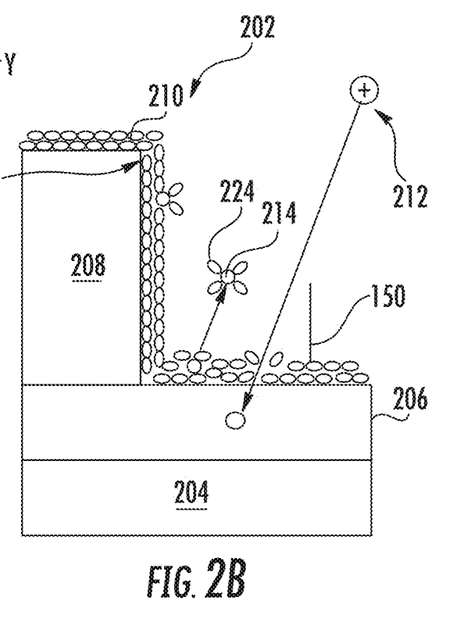
Figure 2C:
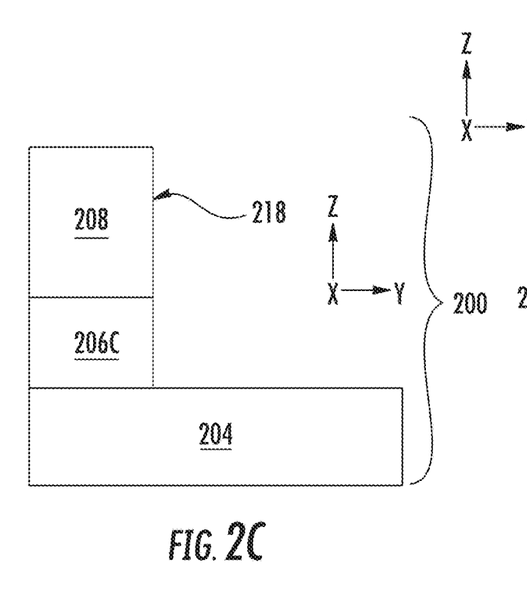

FIG. 2A through FIG. 2C depict an example of substrate etching using a plasma beam in conjunction with point-of-use reactive chemistry according to embodiments of the disclosure. In FIG. 2A there is shown a device structure 202 that includes a base layer 204, and metal layer 206. The base layer 204 may represent more than one layer including a semiconductor wafer, or magnetic storage substrates, as well as other layers. In various embodiments the metal layer 206 may be a metallic material or mixture of metallic material that is resistant to etching by reactive ion etching processes. Examples of such metals include Cu, Ta, Pt, Ru, and other non-volatile metals. In some embodiments a combination of metals such as Pt, Ru, and Ta may be employed in a stack of layers used to form a memory device such as a magnetic random access memory (MRAM).

In order to etch the metal layer 206, to form a feature containing a portion of the metal layer 206, a mask feature may be provided. In one example, the stack 208 may be a mask layer to be removed later, such as a hard mask. In other examples, the stack 208 may include multiple layers including device layers to remain as part of a final device. In these different examples, the stack 208 may act as a mask defining an exposed region 206A and a protected region 206B. In the approach shown in FIG. 2A, a reactive gas 210 may be used in conjunction with a plasma beam to etch the metal layer 206. In some embodiments the reactive gas 210 may be provided from a gaseous source while in other embodiments the reactive gas 210 may be provided from a liquid source. While not shown in FIG. 2A, ions may be provided simultaneously to the substrate 200 together with reactive gas 210. In some embodiments, the reactive gas may be provided to the substrate 200 in an apparatus such as apparatus 102, in conjunction with a plasma beam that directs ions to the substrate 200.

In various embodiments, the reactive gas 210 may be provided to the surface of a substrate 200, wherein the reactive gas 210 is an adsorbing species that condenses to form an adsorbed layer or layers on surfaces presented by the substrate 200. As illustrated in FIG. 2A, the reactive gas may form a conformal coating, shown as the coating 216, in this example being a conformal adsorbed coating. In particular, the coating 216 is disposed on the surface 220 of the metal layer 206, as well as on the sidewall 218 of the stack 208. In some embodiments, the reactive gas 210 may comprise an organic molecule, and in particular embodiments, the reactive gas 210 may comprise a polar molecule. Examples of molecules suitable for reactive gas 210 include methanol (CH3-OH), ethanol (CH3-CH2-OH), isopropanol (CH3-CHOH—CH3), dimethilether (CH3-O—CH3), or acetone (CH3-CO—CH3), or other reactants. The embodiments are not limited in this context. In some cases the reactive gas 210 may be deposited uniformly over substrate surfaces and may coat three dimensional structures in a uniform manner to form the coating 216.

Turning now to FIG. 2B there is shown a further scenario for etching the metal layer 206. In this example, an ion 212, shown as a positive ion, is directed to the substrate 200. The ion 212 may represent a plurality of ions directed in a plasma beam as shown, for example, at FIG. 1A. The ion 212 may form a non-zero angle of incidence with respect to the perpendicular 150, as shown. In other words, the trajectory of ion 212 may not be parallel to the sidewall 218, wherein the ion 212, or a group of ions having similar trajectories, may impinge upon the sidewall 212 as well as the surface 220. In the scenario of FIG. 2B, the ion 212 may penetrate through the coating 216, and strike the metal layer 206, causing a metal species 214 such as a metal atom to be sputter-ejected (sputter etched) from the metal layer 206. This process may happen repeatedly, causing metal to be etched from exposed region 206A. As further shown in FIG. 2B, the sputtered metal, such as metal species 214, may react with the reactive gas 210, including reactive gas adsorbed on the metal layer 206 in coating 216 or in the vicinity of the metal layer 206. In this manner a volatile etch product 224 may be generated containing material from the reactive gas 210 and metal species 214. The volatile etch product 224 may enter the gas phase as shown, and may be transported away from the substrate 200.

In order to prevent the sputtered metal species from redepositing in unwanted areas such as the sidewall 218, the coating 216 may be replenished by condensing species of the reactive gas 210. The reactive gas may form a coating of sub-nanometer thickness, providing an unfavorable surface for redisposition of etched species, such as metal atoms or volatile etch product 224. Accordingly, the metal layer 206 may be removed by a combination of sputtering and reaction with a reactive gas 210, where the reactive gas is provided in an adsorbed coating on a surface of the metal layer 206. Moreover, the reactive gas 210 may condense in a coating 216, where the coating 216 inhibits redisposition of etched metal-containing material.

Turning now to FIG. 2C there is shown a later instance after the processes of FIGS. 2A and 2B have etched the metal layer 206 in the exposed region 206A. In this example, the exposed region 206A has been completely removed, generating the patterned feature 206C of the metal layer 206. As shown, the patterned feature 206C, as well as the stack 208, may have a vertical sidewall for sidewall 218, meaning the sidewall 218 extends parallel to the Z-axis. In addition, the sidewall 218 may be free of redeposited etch product, where the etch product may be the volatile etch product 224 or other material removed from the metal layer 206. The generation of a vertical sidewall free of etch product may result from a combination of the formation of the coating 216 as well as the directionality of the ions provided during etching, such as ion 212. By providing ions at a non-zero angle with respect to the perpendicular 150, where the non-zero angle may be tuned by a control system 132, for example, ions may be directed to the appropriate surfaces at appropriate angles of incidence to ensure that a vertical sidewall profile of the stack 208, as well as patterned feature 206C is maintained.

In some embodiments the process shown in FIGS. 2A to 2C may be performed multiple times to etch a layer stack containing multiple non-volatile metal layers. For example, a layer stack in an MRAM memory cell may include multiple layers including multiple magnetic layers, MgO layer, as well as multiple contact layers, where the contact layers may be composed of Ta, Pt, Fe, Co, Ru, Ti, or other non-volatile metal.

Figure 2D:
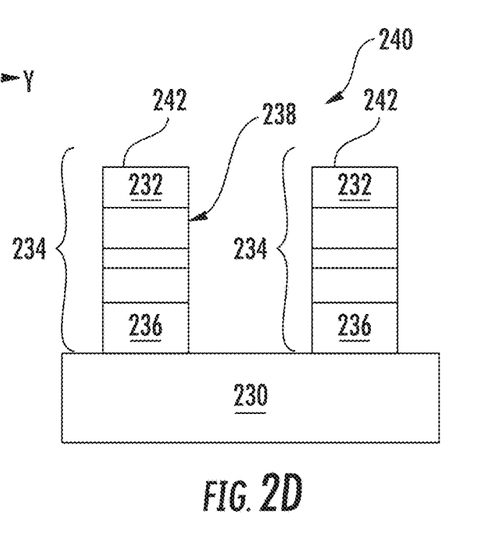

Tuning of plasma beam angle, more than one etch mechanism including eagle angling, multiple layers etched this way. Accordingly, the process of FIGS. 2A to 2C may be used to etch the multiple contact layers. FIG. 2D illustrates an example of a device structure 240 obtained after etching using point-of-use reactive chemistry according to embodiments of the present disclosure. The device structure 240 includes a plurality of pillar structures, shown as pillar structures 242, where the pillar structures are formed by etching a layer stack 234. Within the layer stack 234 there are shown multiple layers including a layer 232 and a layer 236, where the layer 232 as well as layer 236 are non-volatile metals. The layer 232 and layer 236 may be subject to the treatment shown in FIGS. 2A to 2C so etching takes place while avoiding redeposition upon sidewalls 238. Accordingly the pillar structures 242 may have vertical profiles, meaning the sidewalls lie parallel to Z-axis. Additionally, the sidewalls 218 may be free of redeposited metal formed when the layer 232 and layer 236 are etched.

In some embodiments, the etching of layer 232 and layer 236 may be performed by an apparatus such as apparatus 102. In examples, where the pillar structures 242 are part of a memory device, the memory device may be formed in a silicon wafer or other substrate that includes many die having an array of pillars forming a memory device. The etching shown in FIGS. 2A to 2C may be performed across a given substrate such as a silicon wafer by scanning the substrate with respect to an extraction aperture 140. In some embodiments, etching may be performed by scanning a substrate back and forth over a plurality of scans to complete etching of a given layer or stack of layers. In particular embodiments, reactive gas may be provided to a substrate during an entire etch process while ions are directed to a substrate. In other embodiments, the reactive gas may be applied intermittently, such as during one scan out of 10 scans of a substrate.

In some embodiments substrate temperature of a substrate such as substrate 116 may be maintained within a target temperature range to ensure coverage of substrate structures by a condensed layer of the reactive gas is maintained during etching. This target temperature range may be tuned according to the molecule being used for the reactive gas, for example. In various embodiments, the target temperature range may span −60° C. to +400° C.

Figure 3A:
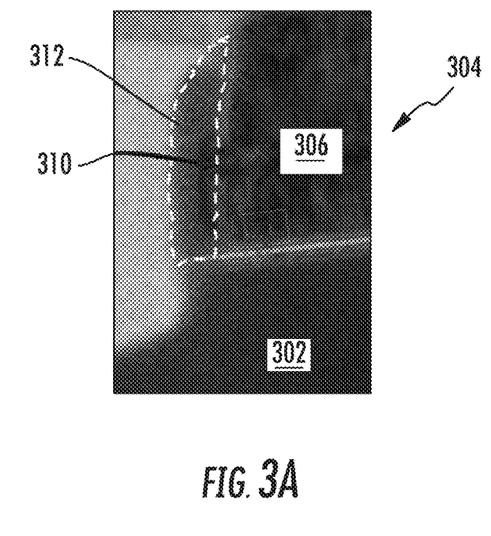
FIG. 3A and FIG. 3B provide results showing the effect of employing point-of-use chemistry during etching of a pillar.
Figure 3B:
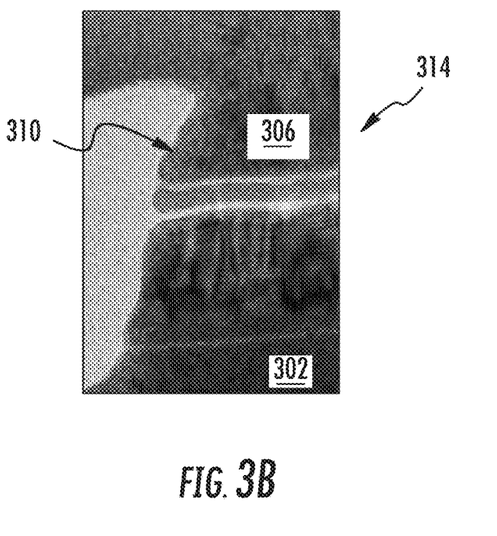

FIG. 3A and FIG. 3B provide results showing the effect of employing point-of-use chemistry during etching on the resulting structure of a pillar device. In FIG. 3A there is shown an electron micrograph of a pillar structure 304 formed by etching a stack including a non-volatile metal layer, where the non-volatile metal layer is etched using argon ions. The pillar structure 304 includes a central portion 306, and a sidewall deposit 312 on sidewall 310 having a width of 10 nm. In FIG. 3B there is shown an electron micrograph of a pillar structure 314 formed by etching a stack including a non-volatile metal layer, where the non-volatile metal layer is etched by providing methanol gas in addition to argon ions during etching. The pillar structure 314 includes in addition to central portion 306, and does not include a sidewall deposit on sidewall 310. Accordingly, redeposition of material along sidewalls is removed in this example by providing methanol directly to a substrate while etching with angled argon ion beams. Notably, redeposition may be controlled by adjusting factors including substrate temperature, amount of methanol provided to the substrate, angle of incidence of ions, among other factors. In some experiments, MRAM arrays having pitch as small as 130 nm were subject to electrical and magnetic measurements. When processed according to the present embodiments using an etch mixture such as methanol and argon ion mixture, where the methanol is applied to the substrate while not passing through a plasma chamber, the arrays have exhibited 98-100% yield. This yield indicates little or no yield loss due to sidewall metal redeposition.

While the aforementioned embodiments emphasize the delivery of a non-dissociated gas and also unexcited reactive gas to a substrate, in some embodiments a fraction of reactive gas molecules may be excited, or ionized, or partially or fully dissociated before impinging upon a substrate. The fraction of such species may be tuned to promote reactivity while maintaining a layer or coating of condensed gas species to inhibit redeposition of etch products on sidewalls.

Figure 4:
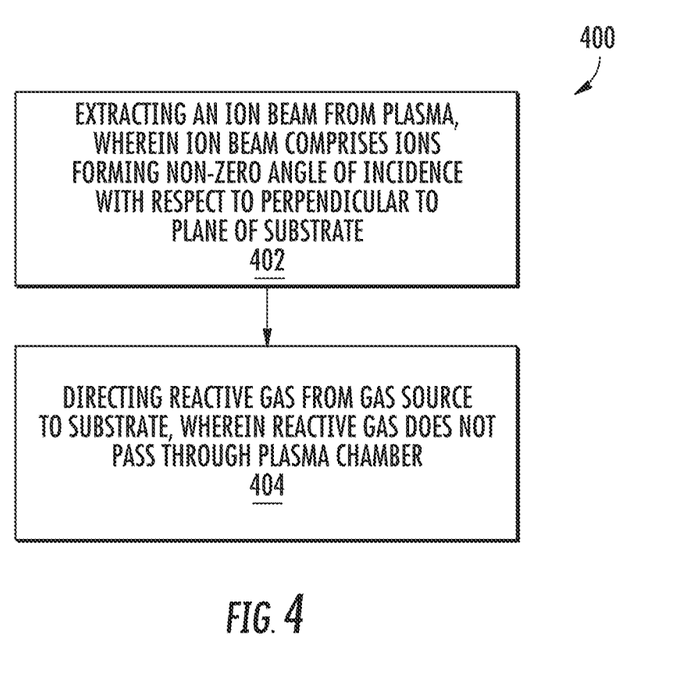
FIG. 4 depicts an exemplary process flow.

FIG. 4 depicts an exemplary process flow 400. At block 402, the operation is performed of extracting a plasma beam from a plasma, wherein the plasma beam comprises ions forming a non-zero angle of incidence with respect to a perpendicular to a plane of a substrate. In some embodiments, the plasma beam may be extracted through an extraction aperture having an aperture width along a first direction and an aperture length along a second direction perpendicular to the first direction, wherein the aperture width is greater than the aperture length, wherein the plasma beam is a ribbon beam.

At block 404, the operation is performed of directing a reactive gas from a gas source to the substrate, wherein the reactive gas does not pass through the plasma. In some examples, the reactive gas may be provided through a gas outlet system that provides reactive gas to the substrate, where the reactive gas remains in a neutral state and undecomposed when impinging upon the substrate.

The present embodiments provide various advantages over conventional processing to define features in a substrate. One advantage lies in the ability to perform etching of non-volatile metals to form patterned features while avoiding or reducing redeposition of etched material on patterned features. Another advantage is the ability to independently deliver sputtering ions and reactive gas to a substrate to provide independent tuning of sputtering ions and reactive gas during etching.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, the present disclosure has been described herein in the context of a particular implementation in a particular environment for a particular purpose, while those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method of treating a substrate, comprising:
   extracting a plasma beam from a plasma in a plasma chamber, wherein the plasma beam is extracted through an extraction aperture of an extraction plate and comprises ions forming a non-zero angle of incidence with respect to a perpendicular to a plane of the substrate; and
   directing a reactive gas from a gas source to the substrate through a plurality of gas orifices extending along top and bottom sides of the extraction aperture, wherein the reactive gas does not pass through the plasma.

2. The method of claim 1, wherein the directing the reactive gas comprises providing a gas comprising a polar molecule to the substrate, wherein the ions are inert gas ions that sputter etch a metal species from a metal layer disposed on the substrate, and wherein the polar molecule forms a volatile etch product with the metal species.

3. The method of claim 2, wherein the directing the reactive gas comprises forming a conformal coating derived from the reactive gas on the metal layer.

4. The method of claim 2, wherein the substrate comprises at least one surface feature having a sidewall, wherein the reactive gas and plasma beam etch the metal layer without redeposition of material from the metal layer on the sidewall.

5. The method of claim 2, wherein the reactive gas comprises a polar molecule, wherein the metal comprises at least one of Ta, Pt, Ru, Ti, Cu, Fe, and Co.

6. The method of claim 1, wherein the extraction aperture has an aperture width along a first direction and an aperture length along a second direction perpendicular to the first direction, wherein the aperture width is greater than the aperture length, wherein the plasma beam is a ribbon beam.

7. The method of claim 6, wherein the extraction plate comprises a plurality of gas orifices, coupled to the channel, wherein the plurality of gas orifices are arranged along at least one side of the extraction aperture along the first direction.

8. A method of etching a substrate, comprising;
   providing a device structure, the device structure, comprising a metal layer, and a stack, disposed on the metal layer; and
   directing a plasma beam in conjunction with a reactive gas to the substrate, wherein the plasma beam is extracted from a plasma in a plasma chamber through an extraction aperture of an extraction plate, and the reactive gas is directed from a gas source to the substrate without passing through the plasma and is further directed through a plurality of gas orifices extending along top and bottom sides of the extraction aperture.

9. The method of claim 8, wherein the plasma beam comprises ions forming a non-zero angle of incidence with respect to a perpendicular to a plane of the substrate.

10. The method of claim 8, wherein the directing the reactive gas comprises providing a gas comprising a polar molecule to the substrate, wherein the ions are inert gas ions that sputter etch a metal species from the metal layer, and wherein the polar molecule forms a volatile etch product with the metal species.

11. The method of claim 8, wherein the directing the reactive gas comprises forming a conformal coating derived from the reactive gas, on the metal layer.

12. The method of claim 8, wherein the stack comprises a sidewall, wherein the reactive gas and plasma beam etch the metal layer without redeposition of material from the metal layer on the sidewall.

13. The method of claim 8, wherein the reactive gas comprises a polar molecule, wherein the metal comprises at least one of Ta, Pt, Ru, Ti, Cu, Fe, and Co.

14. The method of claim 8, wherein the reactive gas and the metal form a volatile etch product, including the reactive gas and the metal.

15. The method of claim 8, wherein the stack comprises a plurality of layers of a magnetic random-access memory device.

* * * * *